United States Patent
Bürgel et al.

(10) Patent No.: US 7,005,015 B2
(45) Date of Patent: *Feb. 28, 2006

(54) HIGH-TEMPERATURE-RESISTANT COMPONENT AND PROCESS FOR PRODUCING THE HIGH-TEMPERATURE-RESISTANT COMPONENT

(75) Inventors: Ralf Bürgel, Melle (DE); Winfried Esser, Bochum (DE); Jörn Grossmann, Hattingen (DE); Wolfgang Hermann, Mülheim A.D. Ruhr (DE); Hael Mughrabi, Buckenhof (DE); Jürgen Preuhs, Oberhausen (DE); Florian Pyczak, Buckenhof (DE); Alfred Scholz, Reinheim (DE); Robert Singer, Erlangen (DE); Andreas Volek, Erlangen (DE)

(73) Assignee: Seimens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/059,541

(22) Filed: Jan. 29, 2002

(65) Prior Publication Data
US 2002/0157738 A1    Oct. 31, 2002

Related U.S. Application Data

(63) Continuation of application No. PCT/EP00/07079, filed on Jul. 24, 2000.

(51) Int. Cl.
 C22C 19/05    (2006.01)

(52) U.S. Cl. .............. 148/428; 420/448; 420/449; 420/450

(58) Field of Classification Search ........... 148/428; 420/448, 449, 450
See application file for complete search history.

(56) References Cited

U.S. PATENT DOCUMENTS

| 5,122,206 A | 6/1992 | Wakita et al. |
|---|---|---|
| 5,154,884 A * | 10/1992 | Wukusick et al. .......... 420/448 |
| 5,611,670 A | 3/1997 | Yoshinari et al. |
| 6,521,175 B1 * | 2/2003 | Mourer et al. ............. 420/448 |
| 2003/0103862 A1 * | 6/2003 | Bouse ....................... 420/448 |

FOREIGN PATENT DOCUMENTS

| DE | 23 33 775 A1 | 1/1975 |
| EP | 0 297 785 A2 | 1/1989 |
| JP | 09 157 777 A | 6/1997 |

OTHER PUBLICATIONS

English Language Machine Translation of Japnaese Patent Document No. 09-157777, Akira et al., Jun. 17, 1997.*

* cited by examiner

Primary Examiner—John P. Sheehan
(74) Attorney, Agent, or Firm—Laurence A. Greenberg; Werner H. Stemer; Ralph E. Locher

(57) ABSTRACT

A high-temperature component made of a nickel super-alloy has the following composition in wt %: 11–13% of Cr, 3–5% of W, 0.5–2.5% of Mo, 3–5% of Al, 3–5% of Ti, 3–7% of Ta, 1–5% of Re and a remainder formed of nickel. A corresponding component which is also provided is formed of an alloy having a composition essentially similar to that mentioned above, but with the rhenium proportion replaced with 0.1–5 wt % of ruthenium.

4 Claims, 4 Drawing Sheets

|    | Cr   | W   | Mo  | Al  | Ti  | Co  | Nb | Ta  | Hf      | Zr    | B      | C    | Re  | Ru  |
|----|------|-----|-----|-----|-----|-----|----|-----|---------|-------|--------|------|-----|-----|
| L1 | 12,0 | 4,0 | 1,9 | 3,8 | 3,9 | –   | –  | 6,0 | <100ppm | 80ppm | 125ppm | 0,08 | –   | –   |
| L2 | 12,0 | 3,5 | 1,5 | 3,8 | 3,9 | –   | –  | 6,0 | <100ppm | 80ppm | 125ppm |      | 2,5 | –   |
| L3 | 12,0 | 3,5 | 1,5 | 3,8 | 3,9 | –   | –  | 6,0 | <100ppm | 80ppm | 125ppm |      | 2,5 | 1,0 |
| L4 | 12,0 | 3,5 | 1,5 | 3,8 | 3,9 | –   | –  | 6,0 | <100ppm | 80ppm | 125ppm |      | 5,0 | 2,0 |
| L5 | 12,0 | 4,0 | 1,9 | 3,8 | 3,9 | 9,0 | –  | 6,0 | <100ppm | 80ppm | 125ppm |      | –   | 1,0 |
| L6 | 12,0 | 4,0 | 1,9 | 3,4 | 3,9 | 9,0 | –  | 4,0 | <100ppm | 80ppm | 125ppm |      | 3,0 | –   |

FIG 3

| | C | Cr | Mo | Ni | W | Co | Ti | Ta | Al | B | Zr | Hf | Re | Ru |
|---|---|---|---|---|---|---|---|---|---|---|---|---|---|---|
| L7 | 0,090 | 12,00 | 1,90 | 59,69 | 4,00 | 9,00 | 3,40 | 5,00 | 3,40 | 0,0125 | 0,008 | <0,010 | 1,50 | - |
| L8 | 0,090 | 11,50 | 1,85 | 60,89 | 3,70 | 8,50 | 3,75 | 3,90 | 3,30 | 0,0120 | 0,01 | - | 2,50 | - |
| L9 | 0,090 | 11,50 | 1,85 | 60,89 | 3,70 | 8,50 | 3,75 | 3,90 | 3,30 | 0,0120 | 0,01 | - | 2,50 | - |
| L10 | 0,090 | 11,50 | 1,85 | 61,39 | 4,70 | 8,50 | 3,75 | 3,90 | 3,30 | 0,0125 | 0,008 | <0,010 | 1,00 | - |
| L11 | 0,090 | 11,50 | 1,85 | 60,89 | 4,70 | 8,50 | 3,75 | 3,90 | 3,30 | 0,0125 | 0,008 | <0,010 | 1,50 | - |
| L12 | 0,090 | 11,50 | 1,85 | 60,39 | 4,70 | 8,50 | 3,75 | 3,90 | 3,30 | 0,0125 | 0,008 | <0,010 | 2,00 | - |

Fig 4

also be present instead of rhenium or hafnium. Furthermore, it is optionally possible to provide 0.05–3% of molybdenum or tungsten.

HIGH-TEMPERATURE-RESISTANT COMPONENT AND PROCESS FOR PRODUCING THE HIGH-TEMPERATURE-RESISTANT COMPONENT

CROSS-REFERENCE TO RELATED APPLICATION

This application is a continuation of copending International Application No. PCT/EP00/07079, filed Jul. 24, 2000, which designated the United States.

BACKGROUND OF THE INVENTION

Field of the Invention

The invention relates to a high-temperature-resistant component made from a nickel-base superalloy. The invention also relates to a process for producing the component.

German Published, Non-Prosecuted Patent Application DE 23 33 775 B2 describes a process for the heat treatment of a nickel alloy. The nickel alloy includes up to 0.3% of carbon, 11–15% of chromium, 8–12% of cobalt, 1–2.5% of molybdenum, 3–10% of tungsten, 3.5–10% of tantalum, 3.5–4.5% of titanium, 3–4% of aluminum, 0.005–0.025% of boron, 0.05–0.4% of zirconium and a remainder of nickel. Furthermore, the alloy additionally includes 0.01–3% of hafnium, so that a block-like carbide formation and a finely dispersed precipitation of an $Ni_3(Al,Ti)$ phase is achieved through a suitable heat treatment. There is no mention of rhenium or ruthenium being added.

U.S. Pat. No. 5,611,670 discloses a rotor blade for a gas turbine. The rotor blade has a monocrystalline platform area and a monocrystalline blade part. A securing area of the blade is constructed with a directionally solidified structure. The blade is cast from a superalloy which has the following composition, in percent by weight: up to 0.2% of carbon, 5–14% of chromium, 4–7% of aluminum, 2–15% of tungsten, 0.5–5% of titanium, up to 3% of niobium, up to 6% of molybdenum, up to 12% of tantalum, up to 10.5% of cobalt, up to 2% of hafnium, up to 4% of rhenium, up to 0.035% of boron, up to 0.035% of zirconium and a remainder of nickel. Those wide ranges are used to specify alloy compositions which are suitable, in principle, for proposed gas turbine blades, but do not indicate a composition range which is appropriate with a view to a particular resistance to oxidation and corrosion or strength.

European Patent EP 0 297 785 B1 has disclosed a nickel-base superalloy for single crystals. The superalloy has the following composition, in percent by weight: 6–15% of chromium, 5–12% of tungsten, 0.01–4% of rhenium, 3–9% of tantalum, 0.5–2% of titanium, 4–7% of aluminum and optionally 0.5–3% of molybdenum. This superalloy results both in a resistance to high-temperature cracking and in a resistance to corrosion. The titanium content must not exceed 2% by weight in order not to impair the resistance to corrosion.

U.S. Pat. No. 5,122,206 has disclosed a nickel-base superalloy which has a particularly narrow coexistence zone for the solid and liquid phases and is therefore particularly suitable for a single-crystal casting process. The alloy has the following composition, in percent by weight: 10–30% of chromium, 0.1–5% of niobium, 0.1–8% of titanium, 0.1–8% of aluminum, 0.05–0.5% of copper or, instead of copper, 0.1–3% of tantalum. In the former case, hafnium or rhenium may optionally also be present, in an amount of from 0.05–3%, while in the latter case 0.05–0.5% of copper may also be present instead of rhenium or hafnium. Furthermore, it is optionally possible to provide 0.05–3% of molybdenum or tungsten.

SUMMARY OF THE INVENTION

It is accordingly an object of the invention to provide a high-temperature-resistant component and a process for producing the high-temperature-resistant component, which overcome the hereinafore-mentioned disadvantages of the heretofore-known products and processes of this general type and in which the component is made from a nickel-base superalloy that has particularly favorable properties with regard to its ability to withstand high temperatures, its resistance to oxidation and corrosion and its stability with respect to the formation of intermetallic phases which have the effect of reducing ductility.

With the foregoing and other objects in view there is provided, in accordance with the invention, a high-temperature-resistant component. The component comprises a nickel-base superalloy having a composition including the following elements, in percent by weight:

| | |
|---|---|
| 11–13% | chromium |
| 3–5% | tungsten |
| 0.5–2.5% | molybdenum |
| 3–5% | aluminum |
| 3–5% | titanium |
| 3–7% | tantalum |
| 0–12% | cobalt |
| 0–1% | niobium |
| 0–2% | hafnium |
| 0–1% | zirconium |
| 0–0.05% | boron |
| 0–0.2% | carbon |
| 1–5% | rhenium |
| 0–5% | ruthenium, and |
| a remainder of Ni and impurities. | |

The superalloy of the component described above has been specified for the first time, in terms of its composition, in such a way that the component has particularly favorable properties with regard to its ability to withstand high temperatures, its resistance to oxidation and corrosion and with regard to stability with respect to the formation of intermetallic phases which have the effect of reducing ductility. Extensive experiments which preceded the invention made it possible to determine the specific composition described herein, through the use of which the desired, above-mentioned properties are satisfied to a surprisingly high degree. In particular, the invention is based on a chromium-rich superalloy which acquires a high strength through the addition of rhenium. The formation of embrittling intermetallic phases, which is promoted by rhenium, is controlled by the subtle balance with the other elements in the composition.

In accordance with another feature of the invention, the rhenium content is preferably at least 2% by weight.

It is preferable for the superalloy to contain ruthenium. The addition of ruthenium in particular enables the tendency to form embrittling intermetallic phases to be reduced further. It has proven expedient to add ruthenium particularly with a rhenium content of over 2% by weight. In accordance with a further feature of the invention, in this case, the maximum ruthenium content is preferably 3% by weight, and the minimum ruthenium content is 0.1% by weight.

In accordance with an added feature of the invention, the cobalt content of the superalloy is preferably up to 12% by weight.

In accordance with an additional feature of the invention, the superalloy preferably contains at most 1% by weight of niobium.

With the objects of the invention in view, there is also provided a high-temperature-resistant component, comprising a nickel-base superalloy. The superalloy has a composition including the following elements, in percent by weight:

| | |
|---|---|
| 11–13% | chromium |
| 3–5% | tungsten |
| 0.5–2.5% | molybdenum |
| 3–5% | aluminum |
| 3–5% | titanium |
| 3–7% | tantalum |
| 0–12% | cobalt |
| 0–1% | niobium |
| 0–2% | hafnium |
| 0–1% | zirconium |
| 0–0.05% | boron |
| 0–0.2% | carbon |
| 0.1–5% | ruthenium, and |
| a remainder of Ni and impurities. | |

The advantages of a component of this type emerge in a corresponding way to the above statements made in connection with the advantages of the rhenium-containing component. Surprisingly, it is also possible to achieve a particularly high ability to withstand high temperatures by adding ruthenium and without there being a rhenium content, the resistance to oxidation/corrosion in the composition described likewise being high.

In accordance with another feature of the invention, the cobalt content of the superalloy is lower than 12% by weight, while the niobium content is at most 1% by weight. Preferably, 0–2% by weight of hafnium and/or 0–1% by weight of zirconium and/or 0–0.05% by weight of boron and/or 0–0.2% by weight of carbon are included in the superalloy.

In accordance with a further feature of the invention, the component preferably has a directionally solidified grain structure. In a directionally solidified structure of this type, the grain boundaries are oriented substantially along one axis. This results in a particularly high strength along this axis.

In accordance with an added feature of the invention, the component preferably has a monocrystalline structure. The monocrystalline structure avoids strength-reducing grain boundaries in the component and results in a particularly high strength.

In accordance with an additional feature of the invention, the component is constructed as a gas turbine blade. A gas turbine blade is a component which is exposed to particularly high demands in terms of its ability to withstand high temperatures and its resistance to oxidation/corrosion.

With the objects of the invention in view, there is additionally provided a process for producing a component from a superalloy in accordance with the above-described embodiments, through the use of a conventional casting process. A fine-grained precision-cast structure is achieved for the component in a conventional casting process of this type. This casting process is particularly inexpensive.

With the objects of the invention in view, there is also provided a process for producing a component from a superalloy having the above composition, in which the superalloy is cooled in such a way that it solidifies directionally or in single crystal form, with the cooling taking place in vacuo through the use of a liquid cooling metal. A process of this type, which is known as liquid metal cooling, considerably improves the quality and speed of the casting process. Cooling takes place only by radiation, especially in vacuo. The cooling capacity is considerably increased by a liquid cooling metal. This allows the solidification process, in which the component that is to be solidified is cooled along a component axis, to be optimized for solidification which is as flawless and rapid as possible.

Other features which are considered as characteristic for the invention are set forth in the appended claims.

Although the invention is illustrated and described herein as embodied in a high-temperature-resistant component and a process for producing the high-temperature-resistant component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a table showing alloy compositions; and

FIG. 4 is another table showing alloy compositions.

DESCRIPTION OF THE PREFERRED EMBODIMENTS

Figure 1:
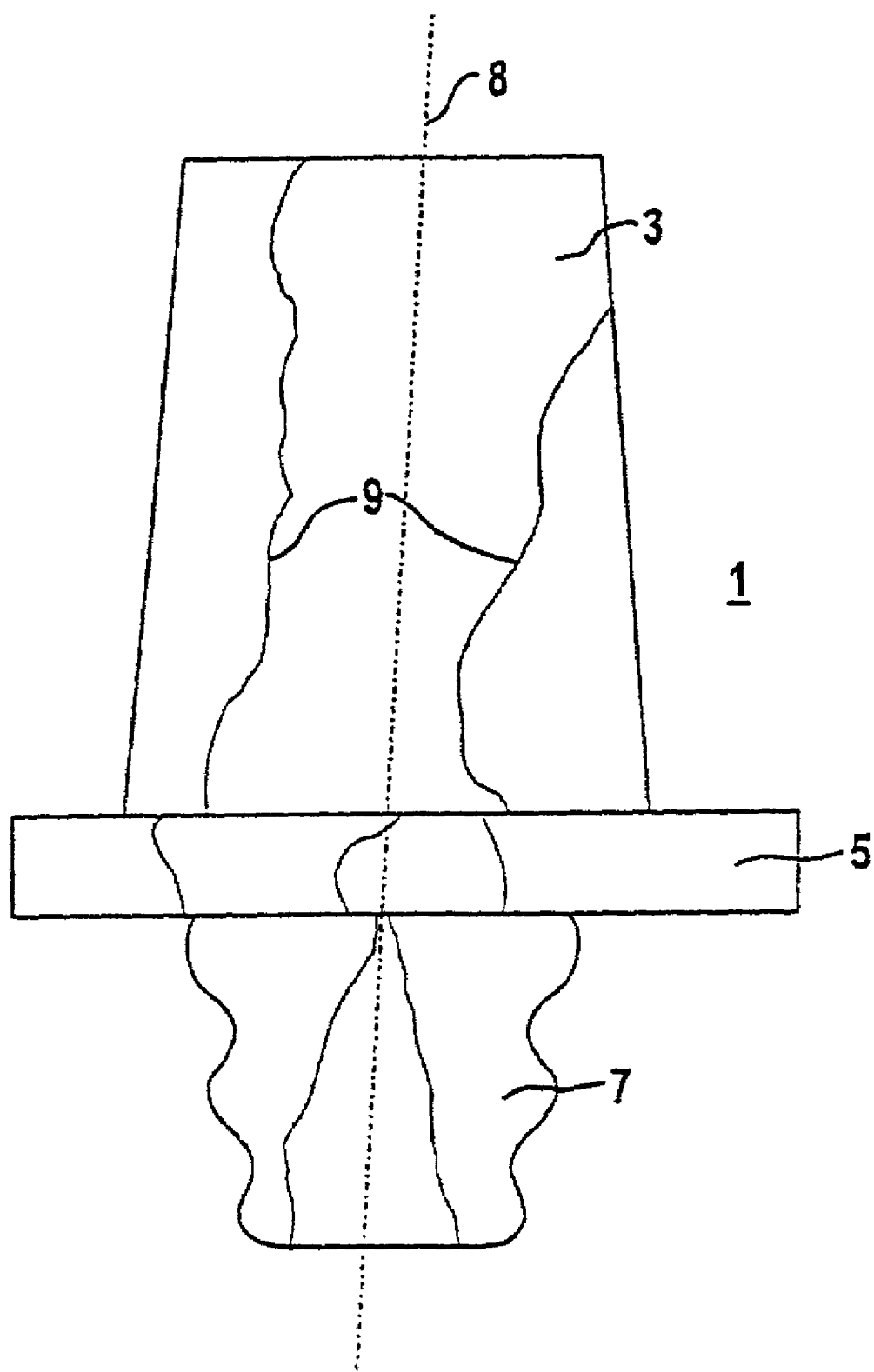
FIG. 1 is a fragmentary, diagrammatic, elevational view of a gas turbine blade.

Referring now to the figures of the drawings in detail and first, particularly, to FIG. 1 thereof, there is seen a high-temperature-resistant component, which is constructed as a gas turbine blade 1. The gas turbine blade 1 has a blade part 3, 16 a platform 5 and a securing area 7. The gas turbine blade 1 is produced in directionally solidified form in a casting process, as a result of which grain boundaries 9 that are oriented along a blade axis 8 are formed.

The gas turbine blade 1 is produced from a nickel-base superalloy which has one of the compositions listed in tables shown in FIGS. 3 and 4. The tables seen in FIGS. 3 and 4 contain the content in percent by weight of one element in each column, for twelve different alloys L1–L12. The remainder, making a total of up to 100%, is nickel and inevitable impurities. A portion of cobalt of between 6 and 10% and a content of zirconium of between 0 and 0.1% is especially advantageous.

Figure 2:
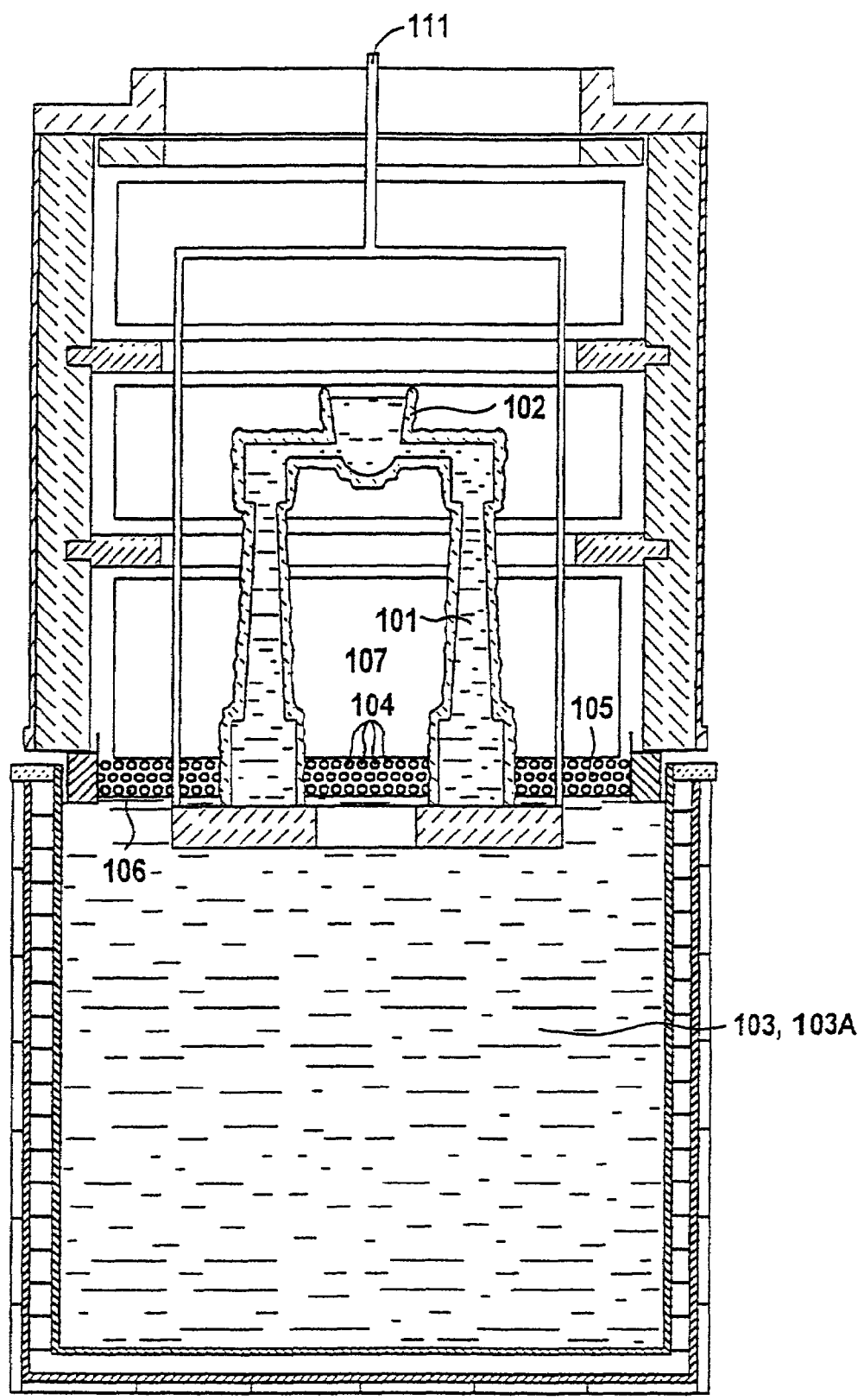
FIG. 2 is a cross-sectional view of an apparatus for carrying out a process for producing a gas turbine blade.

FIG. 2 shows a melt 101 of a metal, in particular of a superalloy, for the production of turbine blades 1 in a casting mold 102. The casting mold 102 is to be immersed in a bath 103 of a liquid cooling medium, preferably tin, an inorganic salt or boron oxide, for the purpose of cooling. A liquid cooling medium 103A is at a second temperature, which is lower than a first temperature of the melt 101. The bath 103 is covered by a covering layer 104, which is formed of a free-flowing, thermally insulating bulk material including spherical solid bodies 105, 106 (hollow beads 105 and solid beads 106). The hollow beads 105 preferably are formed of a ceramic material, such as silicon dioxide/aluminum oxide (mullite). The solid beads 106 preferably are formed of a material such as aluminum oxide, magnesium oxide or zirconium oxide. The solid bodies made from a solid material may also include, for example, particles 106 of a commercially available powder. The covering layer 104 considerably reduces the introduction of heat into the bath 103 from a heating zone 107, in which the casting mold 102 containing the melt 101 is initially held. The casting mold 102 is at a very high first temperature, in particular 1600° C., in the heating zone 107. A high temperature drop, corresponding to a particularly high temperature gradient, is established in the interior of the covering layer 104. Heat is introduced into the melt 101 and the casting mold 102 following the heating zone 107 and heat is dissipated from the melt 101 and the casting mold 102 in the bath 103. Therefore, a high temperature gradient is likewise established in the melt 101 in the area where the casting mold 102 passes through the covering layer 104. A high temperature gradient of this nature results in directional solidification of the melt 101 to form a workpiece or a plurality of workpieces, in particular a turbine blade 1, with a columnar crystal or a single crystal microstructure. The casting mold 102 can be moved into the bath 103 through the use of a holding frame 111.

| Particularly preferred alloys have the following composition: | | |
|---|---|---|
| : | Al: 3.4; | Cr: 12.5%; | Co: 9%; |
| | Mo: 1.9%; | W: 4%; | Ta: 4%; |
| | Ti: 3.9%; | Re: 3% | C: 0.08%; B: 125 ppm; |
| | Zr: 80 ppm; | Hf: <100 ppm; | Ni: bal. |
| 1: | Al: 3.6–4; | Cr: 12.5%; | Co: 9%; |
| | Mo: 1.9%; | W: 4%; | Ta: 6%; |
| | Ti: 3.9%; | C: 0.08%; | B: 125 ppm; |
| | Zr: 80 ppm; | Hf: <100 ppm; | Ni: bal. |
| : | Al: 3.8; | Cr: 12%; | Co: 4%; |
| | Mo: 1.5%; | W: 3.5%; | Ta: 6%; |
| | Ti: 3.9%; | Re: 2.5% | C: 0.08%; B: 125 ppm; |
| | Zr: 80 ppm; | Hf: <100 ppm; | Ni: bal. |
| : | Al: 3.8; | Cr: 12%; | Co: 4%; |
| | Mo: 1.5%; | W: 3.5%; | Ta: 6%; |
| | Ti: 3.9%; | Re: 2.5% | Ru: 1%; C: 0.08%; B: 25 ppm; |
| | Zr: 80 ppm; | Hf: <100 ppm; | Ni: bal. |
| | Al: 3.8; | Cr: 12%; | Co: 4%; |
| | Mo: 1.9%; | W: 4%; | Ta: 6%; |
| | Ti: 3.9%; | Re: 1.5% | C: 0.08%; B: 125 ppm; |
| | Zr: 80 ppm; | Hf: <100 ppm; | Ni: bal. |

What is claimed is:

1. A high-temperature-resistant component, comprising:

a nickel-base superalloy having a composition including the following elements, in percent by weight:

| | |
|---|---|
| 11–13% | chromium |
| 3–5% | tungsten |
| 0.5–2.5% | molybdenum |
| 3–5% | aluminum |
| 3–5% | titanium |
| 3–7% | tantalum |
| 0–12% | cobalt |
| 0–1% | niobium |
| 0–2% | hafnium |
| 0–1% | zirconium |
| 0–0.05% | boron |
| 0–0.2% | carbon |
| 1–5% | rhenium |
| 0–5% | ruthenium, and |
| a remainder of Ni and impurities. | |

2. The component according to claim 1, wherein the ruthenium in said superalloy has a minimum content of 0.5% by weight.

3. The component according to claim 1, wherein the ruthenium in said superalloy has a maximum content of 3% by weight.

4. A gas turbine blade, comprising:

a nickel-base superalloy having a composition including the following elements, in percent by weight:

| | |
|---|---|
| 11–13% | chromium |
| 3–5% | tungsten |
| 0.5–2.5% | molybdenum |
| 3–5% | aluminum |
| 3–5% | titanium |
| 3–7% | tantalum |
| 0–12% | cobalt |
| 0–1% | niobium |
| 0–2% | hafnium |
| 0–1% | zirconium |
| 0–0.05% | boron |
| 0–0.2% | carbon |
| 0.1–5% | ruthenium, and |
| a remainder of Ni and impurities. | |

\* \* \* \* \*

UNITED STATES PATENT AND TRADEMARK OFFICE
CERTIFICATE OF CORRECTION

PATENT NO. : 7,005,015 B2
DATED : February 28, 2006
INVENTOR(S) : Ralf Bürgel et al.

It is certified that error appears in the above-identified patent and that said Letters Patent is hereby corrected as shown below:

<u>Title page,</u>
Item [73], Assignee, should read -- Siemens Aktiengesellschaft, Munich (DE) --.
Item [56], References Cited, OTHER PUBLICATIONS, should read as follows:
-- English Language Machine Translation of Japanese Patent Document No. 09-157777, Akira et al., Jun. 17, 1997.* --.

Signed and Sealed this

Ninth Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 7,005,015 B2
APPLICATION NO. : 10/059541
DATED : February 28, 2006
INVENTOR(S) : Ralf Bürgel et al.

It is certified that error appears in the above-identified patent and that said Letters Patent is hereby corrected as shown below:

Col. 6, lines 1-20 Claim 1 should read as follows:

1. A high-temperature resistant component, comprising:
a nickel- base superalloy having a composition including the following elements, in percent by weight:

| | |
|---|---|
| 11-13% | chromium |
| 3-5% | tungsten |
| 0.5-2.5% | molybdenum |
| 3-5% | aluminum |
| 3-5% | titanium |
| 3-7% | tantalum |
| 0-12% | cobalt |
| 0-1% | niobium |
| 0-2% | hafnium |
| 0-1% | zirconium |
| 0-0.05% | boron |
| 0-0.2% | carbon |
| 0.1-5% | ruthenium; and | a remainder of Ni and impurities.

Signed and Sealed this

Sixth Day of March, 2007

JON W. DUDAS
*Director of the United States Patent and Trademark Office*